US006769089B1

(12) United States Patent
Gupta

(10) Patent No.: US 6,769,089 B1
(45) Date of Patent: Jul. 27, 2004

(54) METHOD AND APPARATUS FOR CONCATENATED CHANNEL CODING IN A DATA TRANSMISSION SYSTEM

(75) Inventor: Alok Kumar Gupta, Carlsbad, CA (US)

(73) Assignee: Ensemble Communicatioins, Inc., San Diego, CA (US)

(*) Notice: Subject to any disclaimer, the term of this patent is extended or adjusted under 35 U.S.C. 154(b) by 0 days.

(21) Appl. No.: 09/471,295

(22) Filed: Dec. 24, 1999

(51) Int. Cl.[7] .............................................. H03M 13/03
(52) U.S. Cl. ..................................... 714/786; 714/755
(58) Field of Search ................................ 714/786, 781, 714/784, 755, 792, 795, 752; 375/240.27, 262, 265

(56) References Cited

U.S. PATENT DOCUMENTS

| | | | | |
|---|---|---|---|---|
| 4,907,233 A | * | 3/1990 | Deutsch et al. | 714/755 |
| 5,457,704 A | * | 10/1995 | Hoeher et al. | 714/794 |
| 5,511,082 A | | 4/1996 | How et al. | |
| 5,838,728 A | * | 11/1998 | Alamouti et al. | 375/265 |
| 6,298,461 B1 | * | 10/2001 | Tong et al. | 714/755 |
| 6,378,101 B1 | * | 4/2002 | Sinha et al. | 714/755 |

FOREIGN PATENT DOCUMENTS

| | | | | |
|---|---|---|---|---|
| EP | 0663775 A2 | 1/1995 | ............ | H04N/7/24 |
| EP | 0663775 A2 | 7/1995 | | |

OTHER PUBLICATIONS

Daniel Cygan, et al., A Concatenated Two–Stage Adaptive (CTSA) Error Control Scheme for Data Transmission in Time–Varying Channels, IEEE Transactions on Communications, vol. 43, No. 43(1995) Feb./Apr., Nos. 2/4, Pt. II, New York, USA.
Michael B. Pursley, et al., A Comparison of Two Methods for Erasure Generation in Frequency–Hop Communications with Partial–Band Interference and Raleigh Fading , Annual Military Communications Conference, U.S., New York, IEEE, vol. Conf. 15, Oct. 22, 1996, pp. 85–89.

Daniel Cygan, et al., A Concatenated Two–Stage Adaptive (CTSA) Error Control Scheme for Data Transmission in Time–Varying Channels , IEEE Transactions on Communications, vol. 43, No. 43(1995) Feb./Apr., Nos. 2/4, Pt. II, New York, USA. pp. 795–800 and 802–803.
C.E. Shannon, "A Mathematical Theory of Communication", Reprinted with corrections from The Bell System Technical Journal, vol. 27, pp 379–423, 623–656, Jul., Oct., 1948, pp. 1–55.
L.H. Charles Lee, "Convolutional Coding, Fundamentals and Applications" Artech House, Inc., 1997, pp. 11–50.
Lin, et al., "Error Control Coding, Fundamentals and Applications", Prentice Hall, 1983, pp. 315–348.
Wolf, et al., "On the Weight Distribution of Linear Block Codes Formed From Convolutional Codes", IEEE, IEEE Transactions on Communications, v 44, No. 9, Sep. 1996, pp 1049–1051.

* cited by examiner

*Primary Examiner*—Christine T. Tu
(74) *Attorney, Agent, or Firm*—Jaquez & Associates; Martin J. Jaquez, Esq.

(57) ABSTRACT

The present invention is a novel method and apparatus for efficiently coding and decoding data in a data transmission system. A concatenated coding scheme is presented that is easily implemented, and that provides acceptable coding performance characteristics for use in data transmission systems. The inventive concatenated channel coding technique is well suited for small or variable size packet data transmission systems. The technique may also be adapted for use in a continuous mode data transmission system. The method and apparatus reduces the complexity, cost, size, power consumption typically associated with the prior art channel coding methods and apparatuses, while still achieving acceptable coding performance. The present invention advantageously performs concatenated channel coding without the necessity of a symbol interleaver. In addition, the present invention is simple to implement and thereby consumes much less space and power that do the prior art approaches. The present invention not only eliminates the need for a symbol interleaver between the outer and inner codes, but it also enjoys a drastically reduced implementation complexity of the inner code Viterbi decoder.

26 Claims, 3 Drawing Sheets

METHOD AND APPARATUS FOR CONCATENATED CHANNEL CODING IN A DATA TRANSMISSION SYSTEM

CROSS-REFERENCE TO RELATED APPLICATIONS

This invention is related to commonly assigned co-pending application Ser. No. 08/974,376, filed Nov. 19, 1997, entitled "An Adaptive Time Division Duplexing Method and Apparatus for Dynamic Bandwidth Allocation within a Wireless Communication System", and co-pending application Ser. No. 09/316,518, filed May 21, 1999 entitled "Method and Apparatus for Allocating Bandwidth in a Wireless Communication System", both applications hereby incorporated by reference herein for their teachings on wireless communication systems.

BACKGROUND OF THE INVENTION

1. Field of the Invention

This invention relates to coding methods and apparatuses, and more particularly to a method and apparatus for concatenated channel coding in a data communication system.

2. Description of Related Art

As described in the commonly assigned related co-pending application Ser. No. 08/974,376, a wireless communication system facilitates two-way communication between a plurality of subscriber radio stations or subscriber units (fixed and portable) and a fixed network infrastructure. Exemplary communication systems include mobile cellular telephone systems, personal communication systems (PCS), and cordless telephones. The key objective of these wireless communication systems is to provide communication channels on demand between the plurality of subscriber units and their respective base stations in order to connect a subscriber unit user with the fixed network infrastructure (usually a wire-line system). In the wireless systems having multiple access schemes a time "frame" is used as the basic information transmission unit. Each frame is sub-divided into a plurality of time slots. Some time slots are used for control purposes and some for information transfer. Subscriber units typically communicate with a selected base station using a "duplexing" scheme thus allowing for the exchange of information in both directions of connection.

Transmissions from the base station to the subscriber unit are commonly referred to as "downlink" transmissions. Transmissions from the subscriber unit to the base station are commonly referred to as "uplink" transmissions. Depending upon the design criteria of a given system, the prior art wireless communication systems have typically used either time division duplexing (TDD) or frequency division duplexing (FDD) methods to facilitate the exchange of information between the base station and the subscriber units. Both the TDD and FDD duplexing schemes are well known in the art.

Recently, wideband or "broadband" wireless communications networks have been proposed for delivery of enhanced broadband services such as voice, data and video. The broadband wireless communication system facilitates two-way communication between a plurality of base stations and a plurality of fixed subscriber stations or Customer Premises Equipment (CPE). One exemplary broadband wireless communication system is described in the co-pending application Ser. No. 08/974,376 which now is a U.S. Pat. No. 6,016,311, and is shown in the block diagram of FIG. 1. As shown in FIG. 1, an exemplary broadband wireless communication system 100 includes a plurality of cells 102. Each cell 102 contains an associated cell site 104 that primarily includes a base station 106 and an active antenna array 108. Each cell 102 provides wireless connectivity between the cell's base station 106 and a plurality of customer premises equipment (CPE) 110 positioned at fixed customer sites 112 throughout the coverage area of the cell 102. The users of the system 100 may include both residential and business customers. Consequently, the users of the system have different and varying usage and bandwidth requirement needs. Each cell may service several hundred or more residential and business CPEs.

The broadband wireless communication system 100 of FIG. 1 provides true "bandwidth-on-demand" to the plurality of CPEs 110. CPEs 110 request bandwidth allocations from their respective base stations 106 based upon the type and quality of services requested by the customers served by the CPEs. Different broadband services have different bandwidth and latency requirements. The type and quality of services available to the customers are variable and selectable. The base station media access control ("MAC") allocates available bandwidth on a physical channel on the uplink and the downlink. Within the uplink and downlink sub-frames, the base station MAC allocates the available bandwidth between the various services depending upon the priorities and rules imposed by their quality of service ("QoS"). The MAC transports data between a MAC "layer" (information higher layers such as TCP/IP) and a "physical layer" (information on the physical channel).

Due to several well known communication phenomenon occurring in the transmission link between the base stations 106 and the CPEs 112, it is well known that the transmission links or channels may be noisy and thereby produce errors during transmission. These errors are sometimes measured as Bit Error Rates (BERs) that are produced during data transmission. Depending upon the severity of these errors, communication between the base stations 106 and the CPEs 112 can be detrimentally affected. As is well known, by properly encoding data, errors introduced by noisy channels can be reduced to any desired level without sacrificing the rate of information transmission or storage. Since Shannon first demonstrated this concept in his landmark 1948 paper entitled "A Mathematical Theory of Communication", by C. E. Shannon, published in the Bell System Technical Journal, pps. 379–423 (Part I), 623–656 (Part II), in July 1948, a great deal of effort has been put forth on devising efficient coding and encoding methods for error control in a noisy communication environment. Consequently, use of error correcting coding schemes has become an integral part in the design of modem communication systems.

For example, in order to compensate for the detrimental effects produced by the noisy communication channels (or for noise that may be generated at both the sources and destinations), the data exchanged between the base stations 106 and the CPEs 112 of the system 100 of FIG. 1 may be coded using conventional combined coding and modulation designs. For example, convolutional or trellis-coded modulation (TCM)-Reed-Solomon (RS) type coders are well known in the art and can be used to code the data as it is exchanged in the system 100 of FIG. 6. Convolutional or TCM-RS concatenation coding schemes are well known in the communication art as exemplified by their description in the text entitled "Convolutional Coding, Fundamentals and Applications", by L. H. Charles Lee, published by Artech House, Inc. in 1997, the entire text of which is hereby fully incorporated by reference for its teachings on convolutional/TCM-RS coding schemes and techniques. As is well known, in the past channel coding designs and modulation designs were treated as separate entities. Hamming distance was considered an appropriate measure for system design. TCM design offers the optimum matching between the channel encoder output code vector and the modulator using a special signal mapping technique.

As is well known, the coding gains produced by coding schemes employing convolutional or TCM coding schemes for the inner codes and RS for the outer codes (i.e., concatenating the convolutional/TCM inner codes with the RS outer codes) is relatively high in terms of the minimum Hamming distance and coding rates achieved. Disadvantageously, the high coding gains achieved by these conventional schemes come at a price in terms of complexity, cost, size, speed, data transmission delays and power. As is well known to those of skill in the art, one of the main disadvantages associated with the prior art concatenated coding schemes is that these techniques require the use of symbol "interleavers". The Convolutional/TCM-RS concatenation techniques must employ a symbol interleaver between the outer and inner codes because when the inner code decoder makes a decoding error, it usually produces a long burst of errors that affect multiple consecutive symbols of the outer decoder. Thus without a deinterleaver, the performance of the outer decoder severely degrades and the effective coding gains produced by the concatenation is lost. Furthermore, the presence of interleaver/deinterleaver distributes the error bursts over multiple outer code words thereby effectively utilizing the power of the outer codes.

In communication systems that transmit only short or variable length packets, a symbol interleaver cannot be utilized because it is impractical. In addition, the symbol interleaver required by the prior art concatenated channel coding schemes increase delays in data transmission. These increased transmission delays may be unacceptable in some applications. For example, when the system 100 of FIG. 1 is used to communicate T1-type continuous data services between the base stations and the CPEs. These type of data services often have well-controlled delivery latency requirements that may not tolerate the transmission delays introduced by the symbol interleavers utilized by the concatenated channel coding schemes of the prior art. Furthermore, the prior art concatenated channel coding schemes are relatively complex to implement and therefore suffer the power, size, and reliability disadvantages as compared with less complex implementations. As a result, prior art channel coding implementations for packet data transmission systems have typically used "single level" coding techniques such as a convolutional, TCM or block code techniques.

Block codes are typically implemented using combination logic circuits. Examples of block codes are Bose-Chaudhuri-Hocquenghem (BCH) codes, Reed-Muller (RM) codes, cyclic codes, array codes, single-error-correcting (SEC) Hamming codes, and Reed-Solomon (RS) codes. Therefore, disadvantageously, packet transmission systems, have not heretofore been able to take advantage of the benefits offered by conventional concatenation coding techniques that provide the advantage of soft-decision decoding of the inner code resulting in larger coding gain and better coding efficiencies.

Therefore, a need exists for a concatenated channel coding method and apparatus that can be easily implemented, provides acceptable coding performance, is well suited for use in small or variable size packet data transmission systems, and overcomes the disadvantages of the prior art concatenated channel coding methods and apparatuses. The present invention provides such a concatenated coding method and apparatus.

SUMMARY OF THE INVENTION

The present invention is a novel method and apparatus for efficiently coding data in a data transmission system. The inventive concatenated channel coding technique is well suited for small or variable size packet data transmission systems. The technique may also be adapted for use in a continuous mode data transmission system. The method and apparatus reduces the complexity, cost, size, power consumption typically associated with the prior art channel coding methods and apparatuses, while still achieving acceptable coding performance. The present invention advantageously performs concatenated channel coding without the necessity of a symbol interleaver. In addition, the present invention is simple to implement and thereby consumes much less space and power that do the prior art approaches. The present invention not only eliminates the need for a symbol interleaver between the outer and inner codes, but it also enjoys a drastically reduced implementation complexity of the inner code Viterbi decoder.

The inventive concatenation technique does not require a symbol interleaver (or deinterleaver on the decoder end) because when the inner code makes a decoding error, it produces only single outer code symbol errors. The present method and apparatus either corrects for the noisy received symbol using a soft decision decoding technique or it produces the erroneous symbol on the output. Consequently, the inner code can be considered as being completely matched or in other words completely dedicated to the task of assisting the outer code in working best.

The asymptotic coding gain of a code decoded with optimum decoding is given as $10\log_{10}(r\,d_{min})$, where r is the code rate and $d_{min}$ is the minimum Hamming distance of the code. The convolutional/TCM code employed in the conventional concatenated coding usually use an inner code having larger $d_{min}$ but the code rate is usually low. The higher the $d_{min}$, the more complex the code usually is. In accordance with the present inventive coding technique, an inner code is selected to have a relatively modest $d_{min}$ value. However, the coding rate is improved and better than the code used by the conventional prior art concatenated coding schemes. Another important parameter which has affect on the performance is $N_{dmin}$. This is the number of paths at distance $d_{min}$ from the correct path. Low values of $N_{dmin}$ are desirable for better performance. But usually, the higher the $d_{min}$, the more complex the code is to implement and it also has lower rate and higher $N_{dmin}$.

The inner code used by the present inventive coding technique has the following three advantages as compared to the prior art approaches: (1) the inner code is matched to the requirements and characteristics of the outer code (this assists the outer decoder in decoding the code in an optimum manner; (2) the inner code yields a coding technique having a relatively high coding rate thereby providing good coding gains with very modest $d_{min}$ values; and (3) the inner code yields low values of $N_{dmin}$.

In the preferred embodiment of the present invention, the outer code is a (N,K) Reed-Solomon code over GF ($2^m$). The inner code prefer ably is a (m+1, m) parity-check code. The minimum Hamming distance $d_{min}$ of the inner code is 2. The overall code rate is given by the following equation, Equation 1:

$$r = \frac{Km}{N(m+1)} = \frac{Km}{(K+R)(m+1)}; \qquad \text{Equation 1:}$$

where R is the redundancy of the RS code, N is the length (measured in symbols) of the RS code, K is the message length (in symbols), and m is the length of the symbol in bits.

The single parity bit can be computed in parallel by an exclusive-OR of m-input bit. Alternately, it can be computed in a sequential manner with a single shift register and a single exclusive-OR gate.

BRIEF DESCRIPTION OF THE DRAWINGS

Like reference numbers and designations in the various drawings indicate like elements.

DETAILED DESCRIPTION OF THE INVENTION

Figure 1:
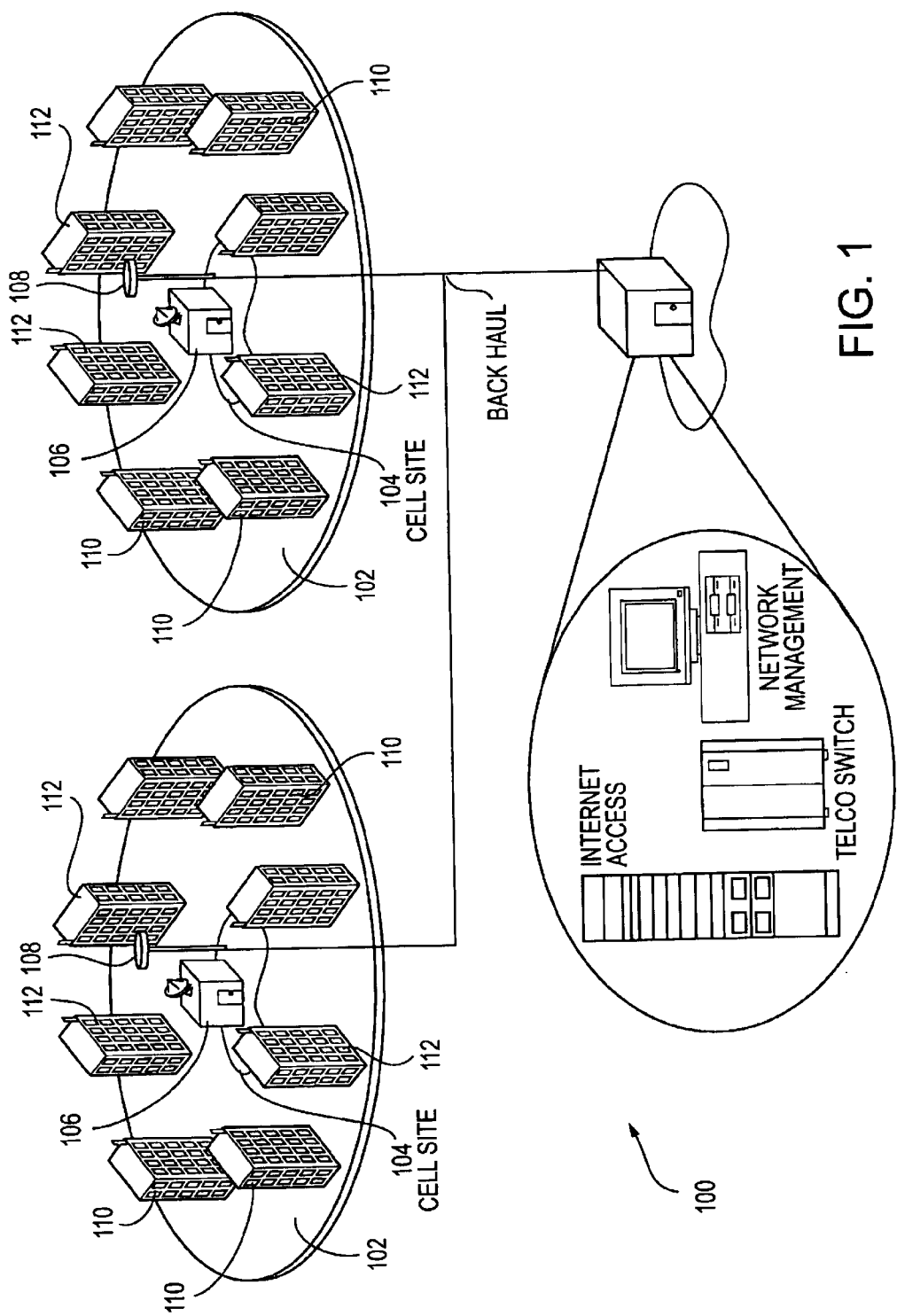
FIG. 1 is a simplified block diagram of a broadband wireless communication system adapted for use with the present invention.

Throughout this description, the preferred embodiment and examples shown should be considered as exemplars, rather than as limitations on the present invention.

One significant advantage of the present concatenated coding technique is that it not only eliminates the need for a symbol interleaver between the outer and inner codes, but it also enjoys drastically reduced implementation complexity of the inner code Viterbi decoder. That is, the Viterbi decoder used to implement the inner code is much less complex than those required by the prior art approaches. Viterbi coders/decoders are well known in the art and are explained in detail in a text by Shu Lin and Daniel Costello, Jr., entitled "Error Control Coding, Fundamentals and Applications", published by Prentice Hall in 1983, the entire text of which is hereby incorporated by reference herein for its teachings on error control coding.

The reason that the present inventive concatenation technique does not require use of an interleaver/deinterleaver is because when the inner code makes a decoding error, it produces only a single outer code symbol errors. In accordance with the present invention, the decoder either "cleans" a noisy received symbol with the aid of soft decision decoding method, or it generates the erroneous symbol. Thus, the inner code in the new system can be considered completely matched or in other words completely dedicated to the task of aiding the performance of the outer code.

As is well known, the asymptotic coding gain of a code decoded with optimum decoding is given as $10\log_{10}(r\, d_{min})$, where r is the code rate and $d_{min}$ is the minimum Hamming distance of the code. The prior art convolutional/TCM code employed in the prior art concatenated coders usually use an inner code having larger $d_{min}$ values. However, the code rate associated with these coders is usually low. The higher the $d_{min}$ value, the more complex is the code. In the concatenated coding scheme presented herein, an inner code is selected having a modest $d_{min}$ value. However, the coding rate is superior to the code used in conventional concatenated code schemes. Also, as is well known, another important parameter which has affect on the performance is $N_{dmin}$. This is the number of paths at distance $d_{min}$ from the correct path. Low value of $N_{dmin}$ is desirable for better performance. But usually, higher the $d_{min}$, more complex the code is to implement and it also has lower rate and higher $N_{dmin}$.

The strength of the inner code used in the inventive concatenated coding technique can be summarized as follows: (1) the inner code is matched to the needs and characteristics of the outer code, thus helping the outer decoder in sort of optimum way; (2) the inner code has a relatively high coding rate thus providing acceptable coding gain even with very modest $d_{min}$; and (3) the inner code yields relatively low values of $N_{dmin}$.

Note that for m=8, the asymptotic coding gain of the inner code, which also turns out to be the actual coding gain (a remarkable fact) is 10log10(2*8/9)=2.49 dB.

Figure 2:
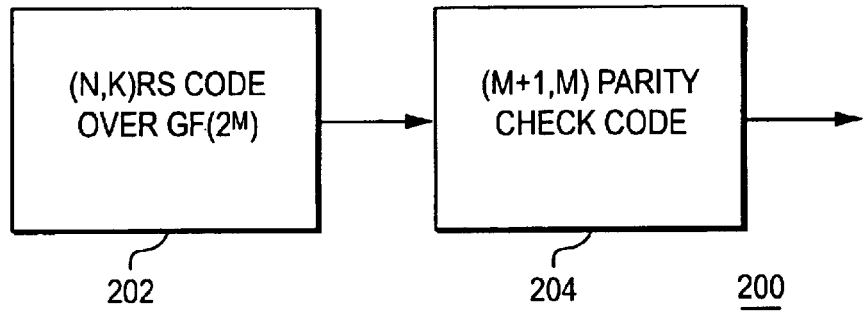
FIG. 2 is a block diagram of an encoder made in accordance with the present invention.

FIG. 2 shows a block diagram of an encoder made in accordance with the present invention. As shown in FIG. 2, the inventive encoder preferably comprises a concatenated channel encoder 200 having an outer code encoder 202 operatively coupled to an inner code encoder 204. The outer code encoder preferably uses an (N,K) Reed-Solomon code over GF($2^m$). These types of RS codes are well known in the art and can be implemented from the teachings provided in the text by Lin and Costello, fully incorporated herein as stated above. In accordance with the present invention, the inner encoder 204 preferably uses an inner code comprising an (m+1, m) parity-check code. Preferably, the minimum Hamming distance $d_{min}$ of the inner code is 2. The overall code rate r is given by the following equation 1:

$$r = \frac{Km}{N(m+1)} = \frac{Km}{(K+R)(m+1)}$$

where R is the redundancy of the RS code; N is the length (measured in symbols) of the RS code, K is the message length (in symbols), and m is the length of the symbol in bits.

The single parity bit can be computed in parallel using an exclusive-OR of m-input bit circuit. Alternately, it can be computed in a sequential manner with a single shift register and a single exclusive-OR gate in a well-known manner.

Figure 3:
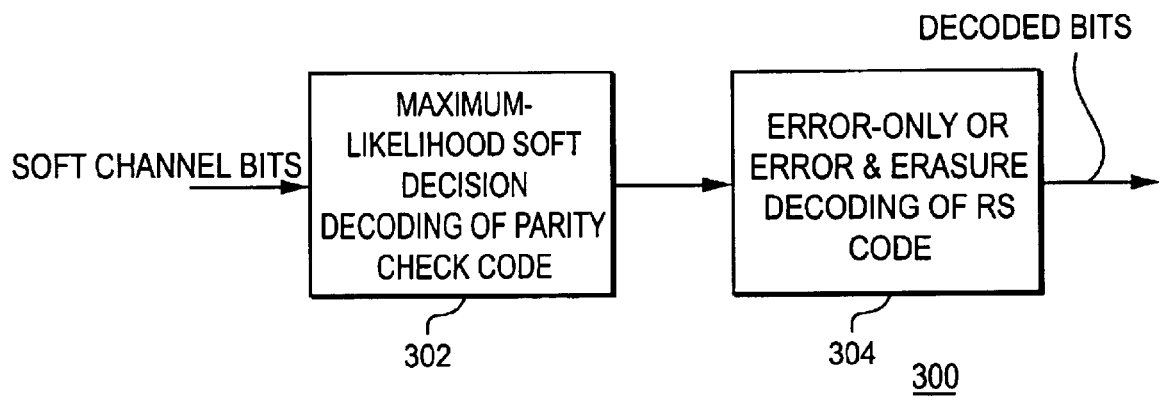
FIG. 3 shows a block diagram of a decoder made in accordance with the present inventive concatenation channel coding method and apparatus.

FIG. 3 shows a block diagram of a decoder made in accordance with the present inventive concatenation channel coding method and apparatus. As shown in FIG. 3, the inventive decoder 300 preferably comprises a Maximum likelihood "soft decision" parity check code decoder 302 operatively coupled to an error-only or error and erasure RS code decoder 304. The parity check code decoder 302 accepts "soft channel bits" in a well known fashion from the communication channel and the demodulator. In the embodiment shown, the soft channel bits comprise "m+1" bits, while the input to the RS decoder 304 comprises "m" bits. The decoder is preferably implemented using a relatively non-complex soft-decision Viterbi decoder which is well known in the art. Such decoders are described in detail at pages 315–384 of the Lin and Costello reference which is incorporated by reference hereinabove.

Figure 4:
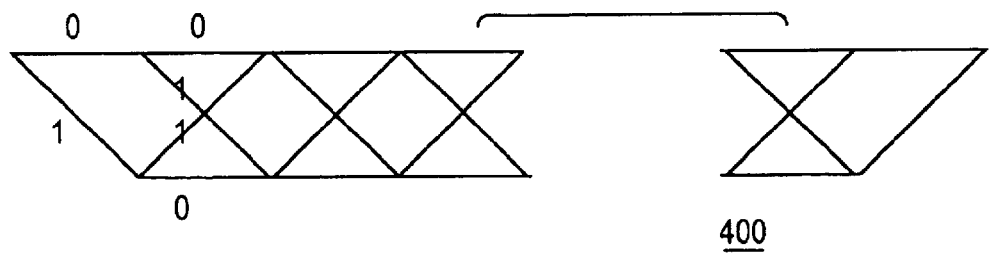
FIG. 4 shows a Trellis diagram of the parity check code in accordance with the present concatenated channel coding technique.

FIG. 4 shows a Trellis diagram 400 of the (m+1, m) parity check code in accordance with the present concatenated channel coding technique. As shown in FIG. 4, the inner code has 2-states trellis diagram with (m+1) stages in the trellis. Hence it can be decoded using a very simple and straightforward soft-decision Viterbi decoder. The trellis terminates to zero state in (m+1) stages. Note that since there are only two states in the trellis and length of the trellis is small number m (typical 8), a register exchange method can be utilized for storing the decoded path through the trellis. Thus, advantageously, there is no decoding delay through this simple 2-states Viterbi decoder. In comparison, the Viterbi decoder used by the prior art concatenated coding schemes employing convolutional/TCM codes is much more complex and has significant decoding delays.

In an alternative embodiment, the inner code can decoding by (1) performing a correlation of the received vector of length "m" with $2^m$ possible code words, and (2) selecting as the decoded output the code word that has a maximum correlation metric. This is a relatively "brute-force" approach for performing optimum decoding. The trellis is a much more efficient way to perform the same task. Alternatively, if the input bit rate is relatively high, it may be desirable to process multiple input samples in parallel. The trellis diagram of FIG. 4 can easily be modified to accomplish this modified approach. This results in a trellis having an increased number of branches but of shorter length.

For example, if the inner code is (9,8) code, then it is possible to combine the three stages in the trellis into a single stage and process three input bits at a time. These are only a few examples of possible alternative implementations possible for the inner code decoder. Essentially these are all equivalent implementation. As one of ordinary skill in the art shall recognize, many alternative implementation approaches may be used without departing from the scope of the present invention.

The inner code works with all type of signal constellations. For higher level constellation like 16 QAM, multiple branch metrics are computed for a single received I,Q pair as follows.

For example, let (b3, b2, b1, b0) represent the 4-bit binary label of a 16 QAM signal constellation. Let y denote the received signal point and S denote the set of 16 QAM signal points for which b3=0. Then the branch metric for bit b3 for hypothesis 0 is given by:

$$\min_{x \subset S} |y - x|^2.$$

Similarly the metrics for other hypothesis and other bits are computed. It is possible to use the distance rather than the squared distance for the branch metrics.

A bit permutator between the inner encoder and modulation symbol mapper may be employed to make the branch metrics in the consecutive stages of the trellis uncorrelated for higher level modulations. This approach may improve the concatenated code performance slightly.

Performance Characteristics Using The Present Inventive Channel Coding Technique Performance characteristics of the inventive coding method and apparatus are now provided. The performance characteristics of an error-only RS decoding technique are described.

The error event probability of the inner code with BPSK or QPSK modulation and decoded with maximum-likelihood soft decision Viterbi decoding is given by the following upper bound (Equation 2)

$$P_e < \sum_{d=d_{min}}^{\infty} a_d Q(\sqrt{2rdE_b/N_0}) \qquad \text{Equation 2:}$$

where, $a_d$ is the number of incorrect paths at Hamming distance d from the correct path that diverge from the correct path and remerge to it at some later stage. One of ordinary skill in the coding/decoding art shall recognize that from the trellis diagram of FIG. 4, for (m+1, m) parity check code $a_{dmin}=m$.

At higher SNR, only the first term is significant. Ignoring the higher order terms convert the above bound (of Equation 2) into an approximate expression. Hence the probability of symbol error at the input of the RS decoder can be given by the following expression (Equation 3)

$$P_s \approx mQ(\sqrt{4rE_b/N_0}) \qquad \text{Equation 3:}$$

The block error probability of the RS code with redundancy R is given by the following Equation 4)

$$P_{block} = \sum_{i=R/2+1}^{N} \binom{N}{i}(P_s)^i(1-P_s)^{N-i} \qquad \text{Equation 4:}$$

Once again, at higher SNR, only the first term in the summation given above is significant. The bit error probability at the output of RS decoder is approximately given by the following expression (Equation 5):

$$P_b \approx \frac{\frac{R}{2}+1}{Nm} \binom{N}{\frac{R}{2}+1}(P_s)^{\frac{R}{2}+1}(1-P_s)^{N-(\frac{R}{2}+1)} \qquad \text{Equation 5:}$$

Figure 5:
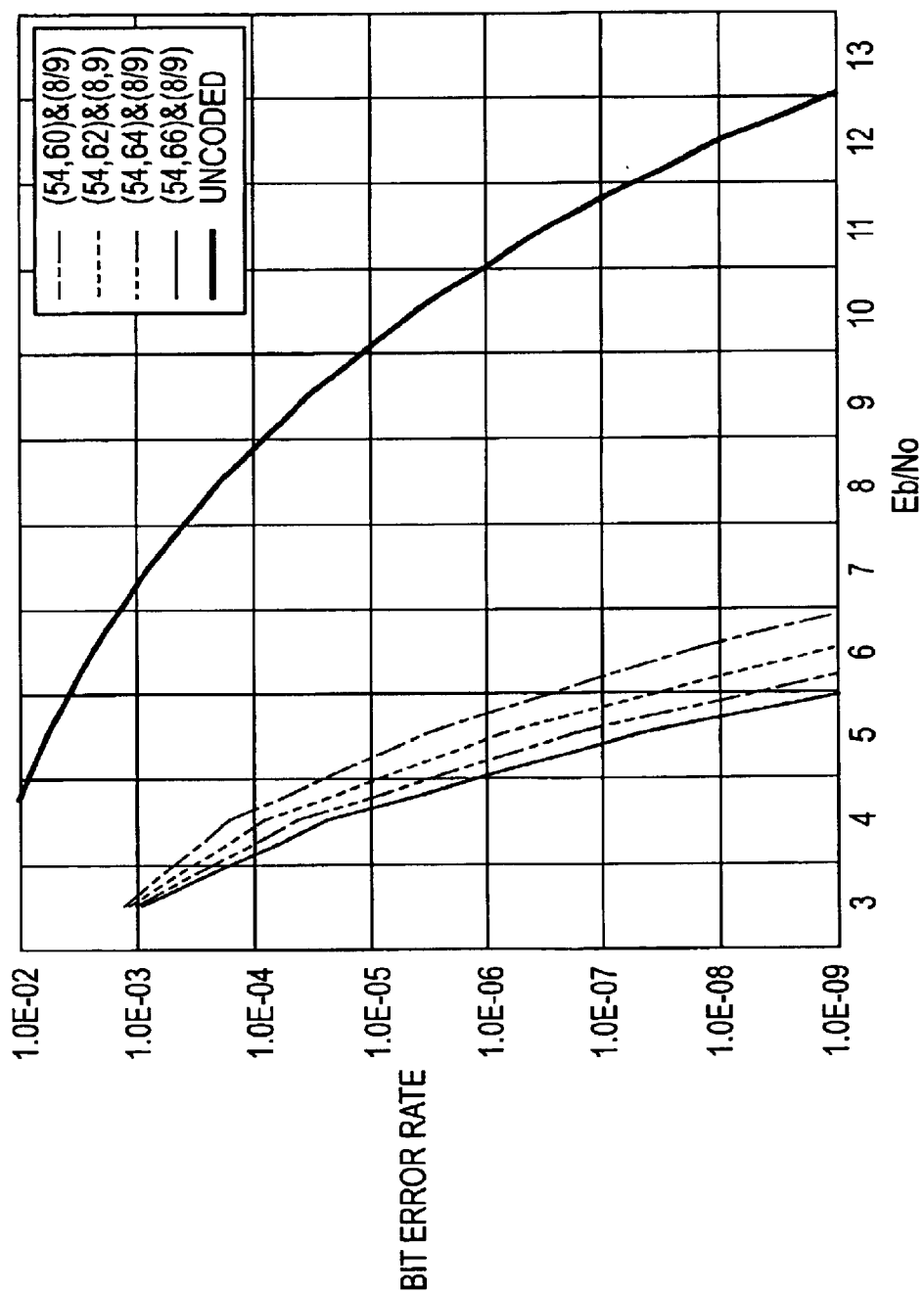
FIG. 5 depicts a graph showing the performance of a data transmission system using QPSK modulation and the concatenated channel coding technique of the present invention.

An example is now described. Let K=54 bytes, thus m=8. FIG. 5 depicts a graph showing the performance of a data transmission system using QPSK modulation and the concatenated channel coding technique of the present invention. The bit error rate of this concatenated system is shown in FIG. 5 for R=6, 8, 10 and 12. At $10^{-9}$ output BER, the coding gain and overall code rate for these 4 codes are presented in Table 1 below.

In one alternative embodiment, the Viterbi decoder of FIG. 3 can be modified such that it outputs reliability information for each symbol that is generated. An error and erasure correcting RS decoder can then be used to further improve the performance of the system using the present invention.

TABLE 1

The Code Rate and Gain for the Exemplary system using Inventive Concatenated Coding Scheme

| R | Code Rate | Coding Gain (dB) |
|---|---|---|
| 6 | 0.80 | 6.15 |
| 8 | 0.774 | 6.50 |
| 10 | 0.75 | 6.80 |
| 12 | 0.7272 | 7.10 |

SUMMARY

A novel inventive concatenated coding scheme has been described, wherein the outer code comprises an RS code over $GF(2^m)$ and the inner code comprises a (m+1, m) single parity check code. The inner code is preferably decoded using a maximum likelihood soft-decision decoding such as is performed using a Viterbi decoding method. In one embodiment, information is provided to the outer decoder regarding the reliability of the symbol that is decoded. The outer decoder preferably comprises either an error-only or error and erasure correcting RS decoder.

A number of embodiments of the present invention have been described. Nevertheless, it will be understood that various modifications may be made without departing from the spirit and scope of the present invention. For example, the actual implementation of the encoder (and decoder) described above may be implemented in an integrated circuit device, software, firmware, in a combinational logic circuit, Read-Only Memory, parallel clocking circuit, or serial circuit as described above. Furthermore, the present inventive method and apparatus can be used in virtually any type of communication system. Its use is not limited to a wireless communication system. Alternatively, the present invention can be used in a wired communication system. Finally, the coding technique may be employed at any convenient location within the data communication system. The coder and decoder can reside in both the base stations 106 and CPEs 112 of the system of FIG. 1. Accordingly, it is to be understood that the invention is not to be limited by the specific illustrated embodiment, but only by the scope of the appended claims.

What is claimed is:

1. A method of concatenated channel coding of data in a data transmission system, comprising:
   (a) obtaining a plurality of data elements for encoding and transmission in a data transmission system;
   (b) generating an outer code for the plurality of data elements using an (N,K) Reed-Solomon (RS) code over GF($2^m$), wherein N comprises a length, measured in symbols, of the RS code, K comprises a message length measured in symbols, and m comprises a length of a symbol measured in bits; and
   (c) generating an inner code for the plurality of data elements using a (m+1, m) parity-check code.

2. The method of concatenated channel coding as defined in claim 1, wherein the inner code generated during the step (c) has a minimum Hamming distance $d_{min}$ equal to 2.

3. The method of concatenated channel coding as defined in claim 2, wherein the inner code yields relatively low values of $N_{dmin}$ and wherein $N_{dmin}$ comprises a number of paths at the distance $d_{min}$ from a correct path.

4. The method of concatenated channel coding as defined in claim 1, wherein an overall code rate for the coding method is given by the following equation:

$$r = \frac{Km}{N(m+1)} = \frac{Km}{(K+R)(m+1)},$$

wherein R comprises a redundancy measure of the RS code, N comprises a length, measured in symbols, of the RS code, K comprises a message length measured in symbols, and m comprises a length of a symbol measured in bits.

5. The method of concatenated channel coding as defined in claim 1, wherein the inner code is matched to selected performance characteristics of the outer code.

6. The method of concatenated channel coding as defined in claim 1, further comprising:
   (d) decoding the plurality of data elements coded using the outer code generated in step (b) and the inner code generated in step (c).

7. The method of concatenated channel coding as defined in claim 6, wherein the decoding step (d) comprises:
   (1) decoding the inner code generated in step (c) using a parity-check code decoder, wherein the parity-check decoder generates a plurality of m decoded data bits associated and corresponding to the plurality of data elements obtained in step (a); and
   (2) decoding the plurality of m decoded data bits of sub-step (1) using an RS code decoder.

8. The method of concatenated channel coding as defined in claim 7, wherein the parity-check code decoder comprises a maximum likelihood soft decision parity-check code decoder.

9. The method of concatenated channel coding as defined in claim 7, wherein the RS code decoder comprises an error-only Reed-Solomon code decoder.

10. The method of concatenated channel coding as defined in claim 7, wherein the RS code decoder comprises an error and erasure Reed-Solomon code decoder.

11. The method of concatenated channel coding as defined in claim 6, wherein the decoding step (d) is performed by a soft-decision Viterbi decoder.

12. The method of concatenated channel coding as defined in claim 6, wherein the decoding step (d) is performed by a two-state Viterbi decoder.

13. The method of concatenated channel coding as defined in claim 6, wherein the decoding step (d) is performed by a plurality of parallel soft-decision Viterbi decoders.

14. The method of concatenated channel coding as defined in claim 6, wherein the decoding step (d) comprises:
   (1) correlating a received vector of length m with a plurality of code words; and
   (2) generating a code word selected from the plurality of code words.

15. The method of concatenated channel coding as defined in claim 14, wherein the plurality of code words comprises $2^m$ code words.

16. The method of concatenated channel coding as defined in claim 15, wherein the sub-step (2) of claim 14 of generating a code word comprises generating a code word having a maximum correlation metric.

17. The method of concatenated channel coding as defined in claim 1, wherein data is modulated using a 16 QAM signal constellation.

18. The method of concatenated channel coding as defined in claim 1, wherein the coding step (c) further comprises generating a bit-permutated inner code.

19. A concatenated channel encoder encoding data in a data transmission system, comprising:
   (a) means for obtaining a plurality of data elements for encoding and transmission in a data transmission system;
   (b) means, coupled to the data element obtaining means, for generating an outer code for the plurality of data elements using an (N,K) Reed-Solomon (RS) code over GF($2^m$), wherein N comprises a length, measured in symbols, of the RS code, K comprises a message length measured in symbols, and m comprises a length of a symbol measured in bits; and
   (c) means, coupled to the outer code generating means, for generating an inner code for the plurality of data elements using a (m+1, m) parity-check code.

20. A concatenated channel encoding apparatus, comprising:
   (a) an outer code encoder, wherein the outer code encoder generates an outer code for a plurality of data elements using an (N,K) Reed-Solomon (RS) code over GF($2^m$), wherein N comprises a length, measured in symbols, of the RS code, K comprises a message length measured in symbols, and m comprises a length of a symbol measured in bits; and
   (b) an inner code encoder, operatively coupled to the outer code encoder, wherein the inner code encoder generates an inner code for the plurality of data elements using a (m+1, m) parity-check code.

21. The concatenated channel encoding apparatus of claim 20, further comprising:
   (c) a soft-decision parity-check code decoder, and
   (d) an RS code decoder, operatively coupled to the parity-check code decoder.

22. The concatenated channel encoding apparatus of claim 21, wherein the parity-check code decoder generates a plurality of m decoded data bits associated and corresponding to the plurality of data elements encoded by the inner and outer code encoders, and wherein the RS code decoder decodes the plurality of m decoded data bits.

23. A data coder/decoder (CODEC) adapted for use in a data communication system, wherein the data communication system includes a plurality of customer premise equipment (CPE) in communication with associated and corresponding base stations, and wherein the base stations each include an associated and corresponding media access control (MAC) having a plurality of MAC data messages, and wherein the MAC transports a MAC data message through a MAC data packet that is mapped to at least one TC/PHY packet in a layered data transport architecture, comprising:

(a) an outer code encoder capable of encoding a plurality of data elements of a selected TC/PHY data packet using an (N,K) Reed-Solomon (RS) code over $GF(2^m)$, wherein N comprises a length, measured in symbols, of the RS code, K comprises a message length measured in symbols, and m comprises a length of a symbol measured in bits;

(b) an inner code encoder, operatively coupled to an output of the outer code encoder, wherein the inner code encoder uses a (m+1, m) parity check code, and wherein the inner code encoder generates a plurality of code words associated with the plurality of data elements; and (c) a decoder, operatively coupled to the inner code encoder, wherein the decoder decodes the code words generated by the inner code encoder.

24. The CODEC as defined in claim 23, wherein the decoder comprises:

(1) a parity-check code decoder; and (2) an RS code decoder, operatively coupled to an output of the parity-check code decoder.

25. An apparatus for coding and decoding data in a data communication system, wherein the data communication system includes a plurality of customer premise equipment (CPE) in communication with associated and corresponding base stations, and wherein the base stations each include an associated and corresponding media access control (MAC) having a plurality of MAC data messages, and wherein the MAC transports a MAC data message through a MAC data packet that is mapped to at least one TC/PHY packet in a layered data transport architecture, comprising:

(a) means for generating an outer code for a plurality of data elements of a selected TC/PHY packet using an (N,K) Reed-Solomon (RS) code over $GF(2^m)$, wherein N comprises a length, measured in symbols, of the RS code, K comprises a message length measured in symbols, and m comprises a length of a symbol measured in bits;

(b) means, coupled to the outer code generating means, for generating an inner code using a (m+1, m) parity check code; and (c) means, coupled to the inner code generating means, for decoding inner code generated by the inner code generating means (b).

26. The apparatus as defined in claim 25, wherein the decoding means comprises:

(1) a maximum likelihood soft decision parity-check code decoding means for decoding the inner code generated by the inner code generating means, and for generating a plurality of decoded bits associated with the plurality of data elements of the selected TC/PHY packet; and (2) a Reed-Solomon code decoding means, operatively coupled to the parity-check code decoding means, for decoding the plurality of decoded bits generated by the parity-check code decoding means.

* * * * *